US006846513B2

United States Patent
Furusawa et al.

(10) Patent No.: US 6,846,513 B2
(45) Date of Patent: Jan. 25, 2005

(54) METHOD FOR FABRICATING A SILICON THIN-FILM

(75) Inventors: Masahiro Furusawa, Suwa (JP); Satoru Miyashita, Chino (JP); Ichio Yudasaka, Chino (JP); Tatsuya Shimoda, Fujimi-cho (JP); Yasuaki Yokoyama, Tokyo (JP); Yasuo Matsuki, Tokyo (JP); Yasumasa Takeuchi, Tokyo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/028,712

(22) Filed: Dec. 28, 2001

(65) Prior Publication Data

US 2003/0087110 A1 May 8, 2003

(30) Foreign Application Priority Data

Dec. 28, 2000 (JP) ........................ 2000-402809

(51) Int. Cl.$^7$ .................... C23C 16/04; C23C 16/24
(52) U.S. Cl. .................. 427/248.1; 427/552; 427/553; 427/256; 427/271; 427/272; 427/282
(58) Field of Search ................. 427/552, 553, 427/555, 558, 226, 248.1, 255.18, 255.23, 256, 258, 259, 261, 264, 265, 270, 271, 272, 282; 423/348, 349; 117/88, 95; 438/503, 507; 118/726

(56) References Cited

U.S. PATENT DOCUMENTS

| 5,869,135 | A | * | 2/1999 | Vaeth et al. | 427/255.14 |
|---|---|---|---|---|---|
| 6,235,605 | B1 | * | 5/2001 | Ping | 438/398 |
| 6,303,277 | B1 | * | 10/2001 | Hieda et al. | 430/322 |
| 6,379,448 | B1 | * | 4/2002 | Sirejacob | 106/287.12 |
| 6,518,087 | B1 | * | 2/2003 | Furusawa et al. | 438/96 |
| 6,541,354 | B1 | * | 4/2003 | Shimoda et al. | 438/478 |
| 2002/0114887 | A1 | * | 8/2002 | Furusawa et al. | 427/314 |

FOREIGN PATENT DOCUMENTS

| EP | 0 823 491 A2 | * | 2/1998 |
|---|---|---|---|
| JP | A 9-237927 | | 9/1997 |
| JP | 2000-012465 A | * | 1/2000 |
| JP | A-2000-079356 | | 3/2000 |
| JP | A-2000-228369 | | 8/2000 |
| WO | WO 97/07429 A1 | * | 2/1997 |
| WO | WO 00/59015 A1 | * | 10/2000 |
| WO | WO 00/59044 A1 | * | 10/2000 |

* cited by examiner

Primary Examiner—Shrive P. Beck
Assistant Examiner—Wesley D. Markham
(74) Attorney, Agent, or Firm—Oliff & Berridge, PLC

(57) ABSTRACT

Provided is a method of forming a silicon thin-film which comprises a step of arranging in one or more parts of a liquid arranging surface liquid which contains a silicide comprising ring silane and/or a derivative thereof, such ring silane comprising silicon and hydrogen, and a step of forming a silicon thin-film by vaporizing silicide from liquid and supplying the silicide to a thin-film-forming surface.

4 Claims, 2 Drawing Sheets

METHOD FOR FABRICATING A SILICON THIN-FILM

RELATED APPLICATION

As a related application, the Japanese Patent Application No. JP2000-402809 filed on Dec. 28, 2000, which is a basic foreign application corresponding to the present invention, is incorporated for reference to the present invention.

DETAILED DESCRIPTION OF THE INVENTION

1. Field of the Invention

The present invention relates to a method of forming a silicon thin-film by a chemical vapor deposition (CVD) method. More particularly, the present invention relates to a silicon thin-film-forming method of forming a thin-film device without patterning.

2. Background Art

In a process of manufacturing an integrated circuit or a thin-film transistor, etc., generally, a silicon thin-film has been formed by a CVD method, using a monosilane gas or a disilane gas. A polysilicon thin-film is formed by a thermal CVD method and an amorphous silicon thin-film is formed by a plasma-activated CVD method. Then, in order to obtain a predetermined pattern of a silicon thin-film, after forming a silicon thin-film on an entire substrate, a patterning process, which removes an unnecessary part by photolithography and etching using a resist, has been performed.

However, the aforementioned method of forming a silicon thin-film pattern using the process of forming a film by the CVD method and the patterning process has problems.

These problems are: (i) Since gaseous hydrosilicon of high toxicity and reactivity is used, a pressure chamber or a vacuum device is required; (ii) Especially in a plasma-activated CVD method, a complex and costly high frequency generator or vacuum device is required; (iii) a patterning process, which has complex steps and is inefficiently uses materials, generates a large amount of waste such as a resist or etchant, etc; (iv) CVD devices are expensive and consume enormous energy for a vacuum system or plasma system; therefore, the cost of forming a film is high.

Consequently, in recent years, methods of forming a silicon thin-film without using a vacuum device have been suggested. For example, the Japanese Patent Laid-Open Publication No. hei 9-237927 discloses a method of, after applying a polysilane solution containing an alkyl group on a substrate, thermally decomposing polysilane to liberate a silicon film. This method, however, has a problem that a silicon thin-film of high electric characteristics can not be obtained, as carbon, which comprises polysilane, which is a material, remains-in the silicon thin-film.

Meanwhile, the Japanese Patent Laid-Open Publication No. 2000-12465 discloses a method of arranging a first silicon film-formed body and a second silicon film-formed body, on a film-forming surface of which a liquid material is applied, both film-forming surfaces facing each other, thereby forming at the same time a silicon film on both film-forming surfaces of the first silicon film formed body and the second silicon film formed body. As a liquid material, liquid silane, which is a silicide not containing carbon and indicated by the general formula $Si_nH_{2n+2}$ or $Si_nH_{2n}$ ($3 \leq n \leq 7$), is used.

This Publication further describes that on the film-forming surface of the first silicon film-formed body, a silicon film is formed by a decomposing reaction of the liquid material applied, and on the film-forming surface of the second silicon film-formed body, a silicon film is formed by a decomposing reaction of a vaporizing matter of the liquid material on the film-forming surface of the first silicon film-formed body.

However, in any method described in any of the aforementioned Publications, in order to obtain a predetermined pattern of a silicon film, it is necessary to perform a patterning process after forming a film.

SUMMARY OF THE INVENTION

The present invention is suggested focusing on these problems of the related art. That is, an object of the present invention is to provide a method of forming a silicon thin-film on a part of a substrate by using a small amount of a liquid material and obtaining a predetermined pattern of a silicon thin-film without the necessity to perform patterning after forming the thin-film.

The present invention is a method for forming a silicon thin-film which comprises a step of arranging in one or more parts of a liquid arranging surface liquid containing a silicide, which comprises ring silane and/or a derivative thereof, such ring silane comprising silicon and hydrogen, and a step of forming a silicon thin-film by vaporizing silicide from the liquid and supplying the silicide to a thin-film-forming surface.

According to this method, a silicon thin-film can be formed only on a part of a thin-film surface, that is, in the neighborhood of a liquid arranging position. For example, this liquid is arranged only in the neighborhood of a device-forming region on a thin-film-forming surface, whereby a silicon thin-film is formed only in the device-forming region on a thin-film-forming surface and in the neighborhood thereof. Consequently, even when a silicon thin-film is formed only on a small part of a large area substrate, it is possible to restrain consumption of materials for a thin-film to a tiny amount.

PREFERRED EMBODIMENTS OF THE INVENTION

Figure 1:
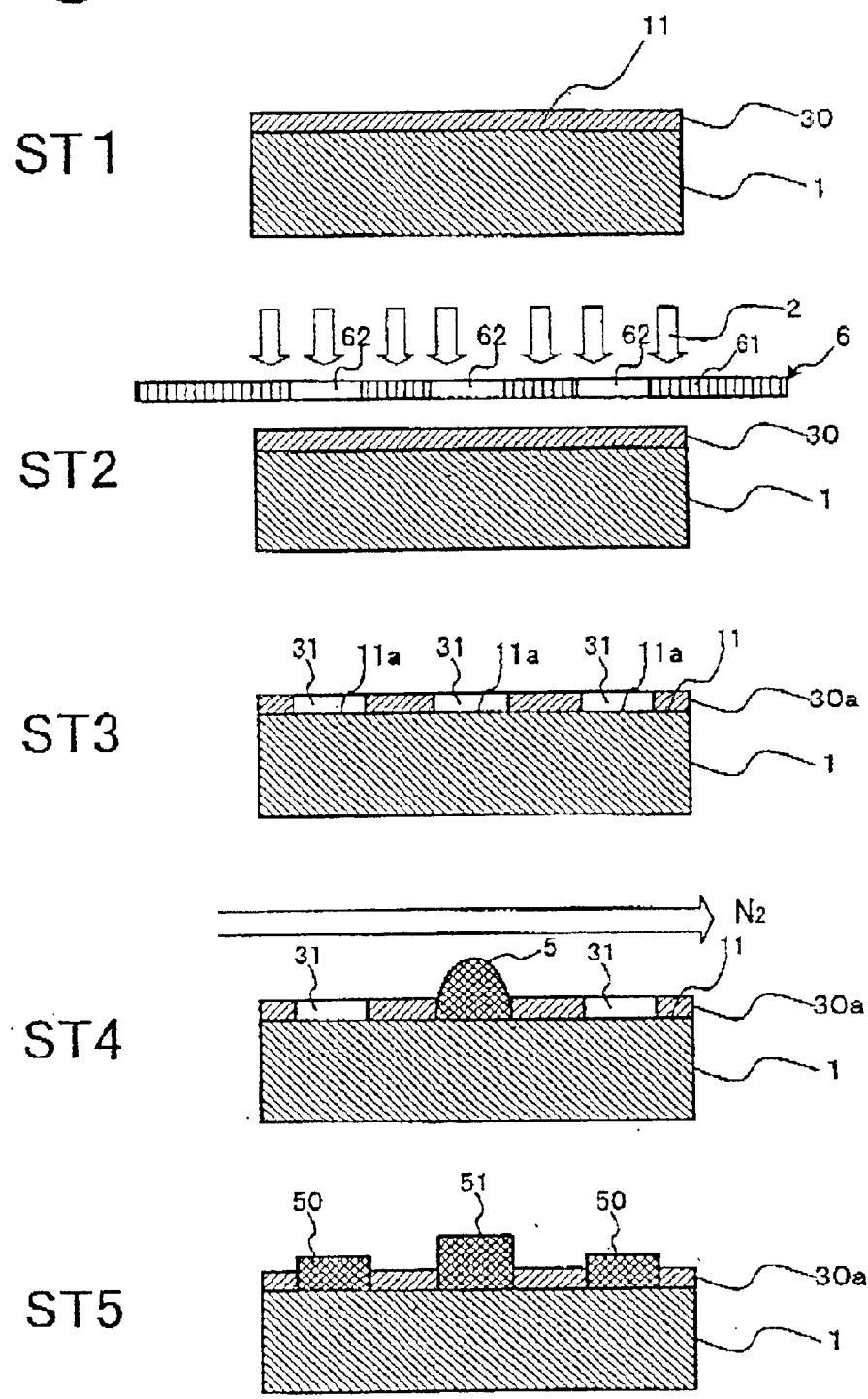
FIG. 1 is a sectional view of a manufacturing process illustrating a method of the first embodiment of-the present invention.

Preferred embodiments of the present invention are explained below.
(First Embodiment)

The first embodiment relates to a first invention which forms a silicon thin-film by providing a thin-film-forming surface and a liquid-arranging surface on a same surface of a substrate. The concept of the present invention is as follows:

That is, the first invention relates to a method for forming a silicon thin-film which comprises a step of arranging in one or more parts of a liquid-arranging surface liquid which contains a silicide comprising ring silane and/or a derivative thereof, such ring silane comprising silicon and hydrogen, and a step of forming a silicon thin-film by vaporizing the silicide from the liquid and supplying the silicide to a thin-film-forming surface. More specifically, in the first invention, a thin-film-forming surface is on the same surface as a liquid-arranging surface is. According to the present invention, a silicon thin-film can be formed only using a substrate for forming a silicon thin-film, not using a dummy substrate for arranging liquid.

Here, in the present invention, microscopically, a silicon thin-film is formed by an operation similar to the case of forming a thin-film by a chemical vapor deposition (CVD) method. The "chemical vapor deposition (CVD)" referred to in this specification means not an ordinary CVD method but this vapor phase epitaxy which is partly performed.

Here, examples of "silicide" which can be used in the present invention are: cyclopentasilane, silylcyclopentasilane, cyclohexasilane, silylcyclohexasilane, cycloheptasilane, 1,1'-biscyclobutasilane, 1,1'-biscyclopentasilane, 1,1-biscyclohexasilane, 1,1'-biscycloheptasilane, 1,1'-cyclobutasilylcyclopentasilane, 1,1'-cyclobutasilylcyclohexalane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2,2]pentasilane, spiro[3,3]heptasilane, spiro[4,4]nonasilane, spiro[4,5]decasilane, spiro[4,6]undecasilane, spiro[5,5]undecasilane, spiro[5,6]dodecasilane, spiro[6,6]tridecasilane, etc.

For a "liquid containing silicide" used in the method of the present invention, for example, it is preferable to use a solution in which cyclopentasilane indicated in the chemical formula (a) below and/or silylcyclopentasilane indicated in the chemical formula (b) below are dissolved in an organic solvent.

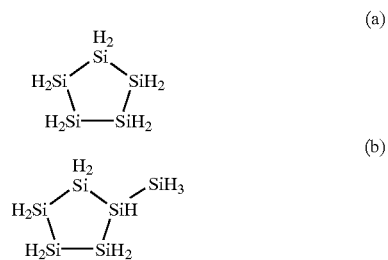

The method of the present invention may further comprise, before performing the step of arranging liquid, a step of forming on a thin-film-forming surface an active region and inactive region for CVD in order to selectively deposit a silicon thin-film.

It is preferable that the step of forming on a thin-film-forming surface an active region and inactive region for CVD comprises a step of, when R is a fluoroalkyl group in which hydrogen on an end side of an alkyl group is replaced with fluorine and X is an alkoxy group or a halogen group, forming a self-assembled film on a film-forming surface, on which a hydroxyl group exists, using a silane derivative indicated by the general formula $RSiX_3$, and a step of performing a physical treatment of the self-assembled film to remove a part of the self-assembled film which is an active region for CVD in order to form an active region and inactive region for CVD. Thus, a predetermined pattern of a silicon thin-film can be obtained without performing a patterning process after forming the thin-film.

When a gasous or liquid silane derivative ($RSiX_3$) coexists on the thin-film-forming surface on which a hydroxyl group exists, X is first hydrolyzed by moisture in the air and becomes fluoroalkylsilanol ($RSi(OH)_3$). A siloxane bonding occurs due to a dehydrate reaction caused by a hydroxyl group of the silanol and a hydroxyl group on the film-forming surface, and a monomolecular film (self-assembled film), a fluoroalkyl group (R) facing outwardly, is formed on the film-forming surface. The surface of this self-assembled film is in an inactive state (low surface energy-and low reactivity) because of the existence of the fluoroalkyl group.

Therefore, the part of the thin-film-forming surface in which a self-assembled film is removed by a physical treatment becomes an active region for CVD, and the part of the thin-film-forming surface in which the self-assembled film remains becomes an inactive region for CVD.

Further, it is preferable to use, as a silane derivative indicated by the general formula $RSiX_3$, fluoroalkylalkoxysilane, e.g., (heptadecafluoro-1,1,2,2-tetrahydornalium)decyl-triethoxysilane, (heptadecafluoro-1,1,2,2-tetrahydornalium) decyl-trimethoxysilane, (tridecafluoro-1,1,2,2-tetrahydronalium) octyl-trimethoxysilane, (tridecafluoro-1,1,2,2-tetrahydro) octyl-triethoxysilane, etc.

Furthermore, a "self-assembled film" in the present invention refers to a monomolecular film in which, by, in the state of gas or liquid, coexisting with the thin-film-forming surface a compound in which a functional group bondable to a constitutive atom on the film-forming surface is bonded to a straight chain molecule, the functional group is absorbed to the thin-film-forming surface and bonded to a constitutive atom on the film-forming surface, and in which a straight chain molecule faces outwardly. This monomolecular film is called a "self-assembled film" because it is formed by voluntary chemical absorption of a compound to the film-forming surface.

Here, a physical treatment may be, for example, ultraviolet irradiation through a photomask or electron beam irradiation to a necessary part.

In the method of the present invention, it is preferable to perform a process of arranging liquid by an inkjet method. Such inkjet method may be a bubble inkjet method in addition to a piezoinkjet method.

In the method of the present invention, it is preferable that a process of vaporizing a silicide is performed while running an inactive gas (nitrogen gas, etc.), a hydrogen gas or a mixed gas of an inactive gas and an hydrogen gas in parallel with a liquid arranging surface of a substrate. Thus, when liquid is arranged on a thin-film-forming surface on which a silicon thin-film is formed, a vaporizing matter from the arranged liquid can easily face the periphery of the liquid arranging position.

Examples of a substrate which provides a liquid arranging surface and a thin-film-forming surface in the present invention are a silicon (Si) wafer, a quartz plate, a glass plate, a plastic film, a metal plate, etc. Among such substrates, those on the surface of which a semiconductor film, a metal film, a derivative film, an organic film, etc. is formed may also be used.

EXAMPLE

Next, an example of the first embodiment is explained using FIG. 1.

First, an ultraviolet ray was irradiated onto a thin-film-forming surface 11 of a glass substrate 1, thereby cleaning the thin-film-forming surface 11. A condition for ultraviolet ray irradiation was that irradiation was performed at a wavelength, strength and time suitable for cleaning. For such condition, for example, the wavelength of an ultraviolet ray of 172 nm, illumination of 10 mW/cm², and the irradiation time of 10 minutes were adopted. Thus treatment, the thin-film-forming surface 11 of the glass substrate 1 reached the state of a hydroxyl group existing all over the surface.

Next, as a step of forming an active region and inactive region for CVD, a self-assembled film is formed on the thin-film-forming surface, in which a hydroxyl group exists, using a silane derivative indicated by the general formula RSiX$_3$. Specifically, a glass substrate 1 in this state was accommodated into a sealed space. In this sealed space, an open-topped chamber containing a predetermined amount, e.g. 0.5 ml of liquid (tridecafluoro-1,1,2,2-tetrahydro) octyl-triethoxysilane (hereinafter referred to as "FAS13") was placed and left for a predetermined time, e.g. for 48 hours. Here, the chemical formula (rational formula) of FAS13 is $CF_3(CF_2)_5(CH_2)_2Si(OC_2H_5)_3$.

By this treatment, the sealed space has an atmosphere of FAS13 vaporized from the chamber. Then, by a dehydrate reaction of a hydroxyl group of silanol, which is generated by hydrolyzing an ethoxy group of FAS13, and a hydroxyl group on the thin-film-forming surface 11 of the glass substrate 1, a siloxane bonding occurs. As a result of that, as shown in ST1 of FIG. 1, on the entire thin-film-forming surface 11 of the glass substrate 1 which is pulled out after being left for 48 hours, a monomolecular film (self-assembled film) 30 was formed in the state of a fluoroalkyl group ($CF_3(CF_2)_5(CH_2)_2$—) facing outwardly. The surface of the monomolecular film 30 has the state of being inactive in terms of CVD.

Next, in order to form an active region and inactive region for CVD, the part of the self-assembled film, which is an active region for CVD is removed by performing a physical treatment of the self-assembled film. In case of this physical treatment, ultraviolet irradiation through a photomask was performed.

For example, as shown in ST2 of FIG. 1, a photomask in which a pattern called "line and space", a linear ultraviolet ray shielding part 61 and a linear ultraviolet ray transmission part 62 being alternately arranged, is prepared. Then, through the photomask 6, an ultraviolet ray 2 is irradiated onto the monomolecular film 30 under predetermined conditions.

As for the conditions of ultraviolet ray irradiation, the ones which can remove the monomolecular film 30, e.g. the wavelength of 172 nm, illumination of 10 mW/cm$^2$, and irradication time of 10 minutes were adopted. Here, the line width of the line and space of the photomask 6 (the width of the line comprising the ultraviolet shielding part 61) was 30 µm and the line pitch (the width of the line comprising the ultraviolet transmission part 62) is 20 µm. The photomask 6 is prepared by, for example, forming a chromium pattern on a quartz substrate. The ultraviolet ray transmission factor of this quartz substrate of the 172 nm wavelength was approximately 60%.

By this treatment, as shown in ST3 of FIG. 1, the part of the monomolecular film 30 which was arranged right under the ultraviolet transmission film 62 of the monomolecular film 30 was removed, and a monomolecular film pattern 30a having a linear opening 31 was formed on the thin-film-forming surface 11 of the glass substrate 1. In the opening 31 of this monomolecular film pattern 30a, a thin-film-forming surface 11a of the glass substrate 1 is exposed. This exposed surface 11a has a hydroxyl group and is in the state of being active for CVD. Meanwhile, the part of the thin-film-forming surface 11 in which a monomolecular film remains (the surface of the monomolecular film pattern 30a) is in the state of being inactive for CVD. Therefore, by the monomolecular film pattern 30a, an active region and inactive region for CVD were formed on the thin-film-forming surface 11 of the glass substrate 1.

Furthermore, here, a monomolecular film 30 was selectively removed by performing ultraviolet irradiation from above the photomask; however, if ultraviolet irradiation means is constructed so as to irradiate an ultraviolet ray to only a specific region, it is not necessary to use a photomask. In place of an ultraviolet ray, the monomolecular film may also be removed by applying electron beam irradiation to a necessary part.

Next, on one or more parts of a substrate surface (which is a thin-film-forming surface as well as a liquid arranging surface), liquid which contains silicide comprising a ring silane and/or a derivative thereof, such ring silane comprising silicon and hydrogen, is arranged. Specifically, as material liquid, for example, a solution in which 8 g of cyclopentasilane and 1 g of silylcyclopentasilane were dissolved in 100 g of toluene (hereinafter referred to as the "cyclosilane solution") is prepared. Then, as shown ST4 of FIG. 1, the glass substrate 1 on which the monomolecular pattern 30a was formed as arranged in the nitrogen atmosphere, and the cyclosilane solution was discharged by the inkjet method to a large number of openings 31 of the monomolecular pattern 30a in every other pattern to arrange a droplet 5.

Next, silicide is vaporized from this liquid and supplied to the thin-film-forming surface. Specifically, substantially in parallel with the liquid arranging surface, one gas selected from a group including an inactive gas, a hydrogen gas and a mixed gas of an inactive gas and a hydrogen gas is released. In this embodiment, a nitrogen gas is used.

For example, as shown in ST4 of FIG. 1, while running a nitrogen gas in parallel with the thin-film-forming surface 11 of the glass substrate 1, the glass substrate 1 was heated to a predetermined temperature, e.g. 350° C. and was retained for a predetermined-time, e.g. 10 minutes. Thus, a part of the droplet 5 comprising the cyclosilane solution was vaporized to become gasous cyclopentasilane and silylcyclopentasilane, and such gases were supplied to the opening 31, in which the droplet 5 of the monomolecular film pattern 30a was not arranged.

These gases are thermally decomposed by heat, and silicon was deposited into the opening 31, whereby, as shown in ST5 of FIG. 1, a silicon thin-film 50 was formed in the opening 31. Meanwhile, on the surface of the monomolecular film pattern 30a, that is, the part in which the monomolecular film remains, the silicon thin-film 50 is not formed. The thickness of the silicon thin-film 50 was, for example, 20 nm.

Further, in the opening 31 in which the droplet 5 was arranged, cyclopentasilane and silylcyclopentasilane in the cyclosilane solution which were not vaporized were thermally decomposed and a silicon film 51, the thickness of which was, for example, 50 nm, is formed.

As described above, according to the method of the first embodiment, by the cyclosilane solution being arranged on a part of a substrate and then vaporized, a silicon film can be easily formed by a CVD method on a part of the substrate, using a small amount of material liquid.

Further, by using an inkjet method, the liquid can be arranged easily and accurately.

Moreover, before arranging the cyclosilane solution, a monomolecular pattern is formed on the thin-film-forming surface and the opening of the monomolecular thin-film pattern is selectively deposited; therefore, a silicon thin-film pattern can be obtained without performing a patterning process after forming the thin-film.

(Second Embodiment)

In the second embodiment of the present invention, a liquid arranging surface is provided on a first substrate and a silicon thin-film is formed on the thin-film-forming surface of a second substrate. The definitions of terms and transformation examples are the same as used in the first invention of the first embodiment; therefore, those used in the first embodiment are also adopted in a second invention.

A second invention is a method of forming a silicon thin-film which comprises a step of arranging in one or more parts of a first substrate for arranging liquid, liquid which contains silicide comprising ring silane and/or a derivative thereof, such ring silane comprising silicon and hydrogen, and a step of arranging a thin-film-forming surface of a second substrate for forming a silicon thin-film to be set facing a liquid arranging surface of the first substrate, and a step of vaporizing silicide from the liquid arranged on the liquid arranging surface of the first substrate and supplying the silicide to the thin-film-forming surface of the second substrate.

According to this method, the cost for the method using two substrates can be reduced.

In the method of the present invention, as in the first invention, it is preferable to perform the process of vaporizing silicide while running an inactive gas (nitrogen gas, etc.), a hydrogen gas or a mixed gas of an active gas and an inactive gas in parallel with the liquid arranging surface of the substrate. Thus, the amount of vaporizing matters headed for the second substrate can be controlled and the thickness of the silicon thin-film formed can be controlled.

In the step of vaporizing silicide in the second invention, the second substrate is heated so as to have a temperature at which a thin-film-forming surface can decompose a vaporizing matter of silicide, and by the heat emitted from the second substrate pursuant to the heating, the first substrate is heated to a temperature at which silicide is vaporized from liquid.

Examples of first and second substrates in the method of the present invention are, as in the first invention, a silicon (Si) wafer, a quartz plate, a glass plate, a plastic film, a metal plate, etc. Among these substrates, those on the surface of which a semiconductor film, a metal film, a derivative film, an organic film, etc. is formed may also be used.

EXAMPLE

Figure 2:
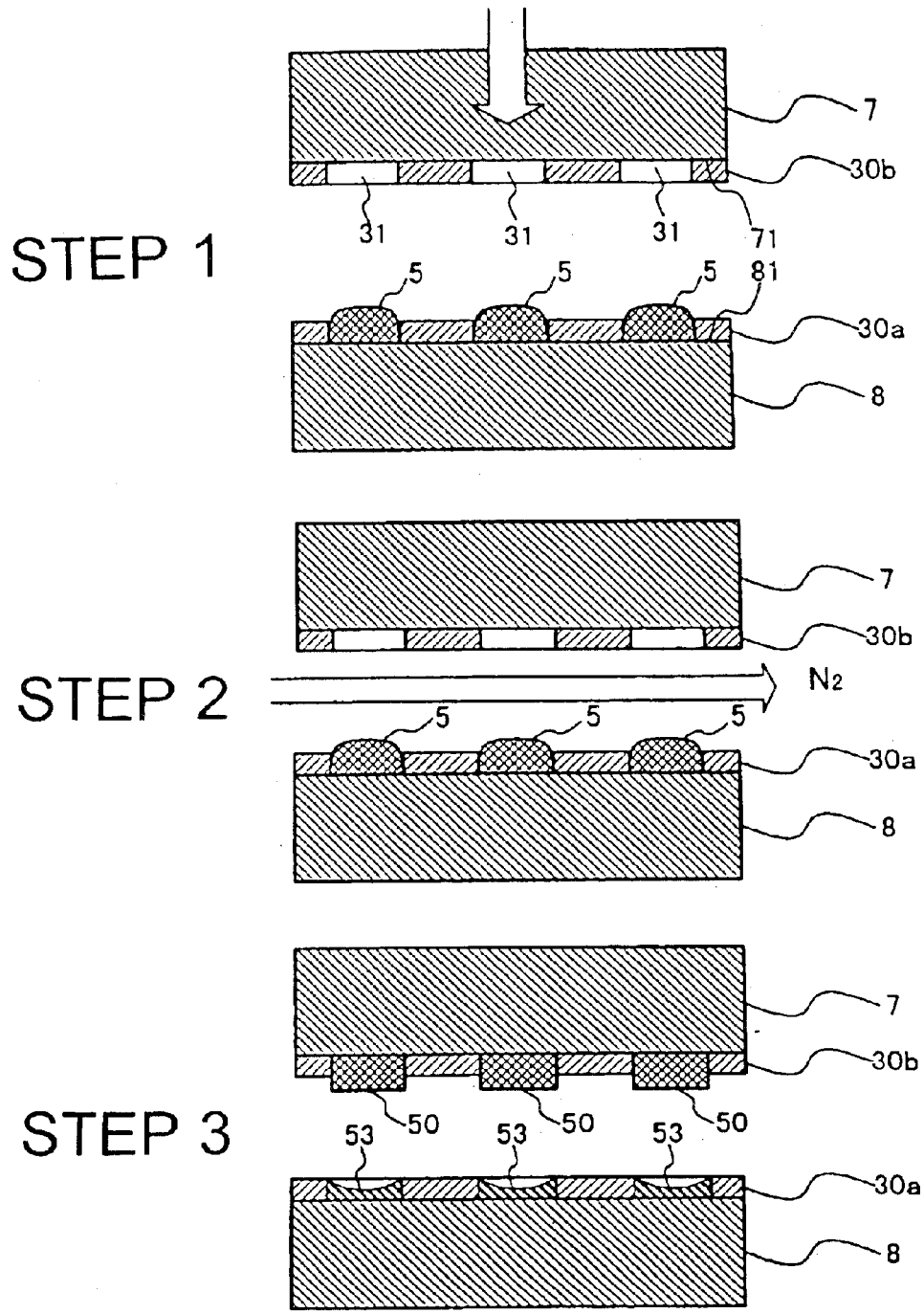
FIG. 2 is a sectional view of a manufacturing process illustrating a method of the second embodiment of the present invention.

Next, an example of the second embodiment is explained using FIG. 2. In principle, the explanation is simplified in the parts which can be considered the same as in the first embodiment.

First, two glass substrates are prepared, and on one side of each of the surfaces of both glass substrates, a pattern comprising a monomolecular film (self-assembled film) is formed by the same method as in the first invention, using FAS 13. That is, the method of the first embodiment was applied to a liquid arranging surface 81 of a first substrate 8 and a thin-film-forming surface 71 of a second substrate 7 to form patterns 30a and 30b of a monomolecular film which have a same form when they were facing each other (cf. STEP 1 in FIG. 2). For example, a photomask, in which a round ultraviolet ray transmission part having the diameter of 50 μm was reticularly arranged at the pitch of 5 mm, was used. By using such photomask, the monomolecular film patterns 30a and 30b also have a form in which a round opening 31 is reticularly arranged. Here, alignment marks were formed in the four corners of the photomask and such marks were transcribed to the monomolecular film patterns 30a and 30b, which is a preferred manner.

Next, by the same method as in the first embodiment, liquid is arranged on the first substrate. That is, the first substrate 8 was arranged in a nitrogen gas atmosphere such that the surface (liquid arranging surface) 81, on which a monomolecular film pattern 30a was formed, facing upwards. Then, the same liquid (cyclosilane solution) as in the first embodiment was discharged by an inkjet method into all openings 31 of the monomolocular pattern 30a to arrange a droplet 5 (cf. STEP 1 of FIG. 2).

Next, the thin-film-forming surface of the second substrate is arranged to be set facing the liquid arranging surface of the first substrate. That is, as shown in STEP 1 of FIG. 2, the second substrate 7 was arranged such that the thin-film-forming surface 71, on which a monomolecular film pattern 30b was formed, faces downwards and was set above and in parallel with the first substrate 8 at a predetermined distance (e.g. 1 mm). In the case of this arrangement, alignment marks formed on the monomolecular film patterns 30a and 30b of the substrates 7 and 8 were aligned and the opening 31, in which the thin-film-forming surface 71 of the monomolecular film pattern 30b of the second substrate 7 was exposed, and the opening 31, in which the droplet 5 in the monomolecular film pattern 30a of the first substrate 8 was arranged, were aligned.

Next, silicide is vaporized from liquid arranged on the liquid arranging surface of the first substrate and supplied to the thin-film-forming surface of the second substrate. Specifically, the second substrate was heated so as to have a temperature at which the thin-film-forming surface can decompose a vaporizing matter of silicide, and by the heat emitted from the second substrate pursuant to the heating, the first substrate is heated to a temperature at which silicide was vaporized from liquid.

For example, as shown in STEP 2 of FIG. 2, while running a nitrogen gas between substrates 7 and 8 and in parallel with the substrate surface, the second substrate 7 was heated to a temperature at which a vaporizing matter of suicide can be decomposed, for example 450° c., and retained for 10 minutes. Thus, the first substrate 8 was indirectly heated by the heat emitted from the second substrate 7 and a part of a droplet 5 on the first substrate 8 comprising the cyclosilane solution was vaporized and supplied into the opening 31 of the monomolecular pattern 30b of the second substrate 7.

Gaseous cyclopentasilane and silylcyclopentasilane vaporized from the droplet 5 were decomposed by heat and silicon was deposited in the opening 31 of the monomolecular pattern 30b of the second substrate 7 and, as shown in STEP 3 of FIG. 2, a silicon thin-film 50 was formed in this opening 31. The silicon thin-film 50 is not formed on the surface (the part in which a monomolecular film remains) of the monomolecular film pattern 30b. The thickness of the silicon thin-film 50 was 50 nm.

Further, even though the temperature of the droplet 5 in the opening 31 of the first substrate 8 does not reach the temperature to decompose cyclopentasilane and silylcyclopentasilane, all of solvents in the cyclosilane solution vaporize. Consequently, in the opening 31 of the first substrate 8, an oily matter 53 comprising cyclopentasilane and silylcyclopentasilane, which was not vaporized from the droplet 5, remained.

As described above, according to the second embodiment, in addition to the same effect as in the first embodiment, since two sheets of substrates 7 and 8 are arranged facing each other and each vaporizing matter from a droplet 5 faces each opening 31 of the monomolecular film pattern 30b, the uniformity of the film thickness in an opening 31 and the uniformity of the film thickness between a plurality of openings 31 can be enhanced.

Further, by forming a monomolecular pattern 30a also in the first substrate 8, an arranging region (opening 31) of a droplet is formed on a liquid arranging surface 81 to arrange a droplet 5 in each opening 31; therefore, in comparison to the case in which such region is not formed, the amount of the materials used can be reduced.

Furthermore, the accuracy of the position to arrange a droplet can be enhanced.

Moreover, only the second substrate 7 is directly heated and the first substrate 8 is indirectly heated by the heat emitted from the second substrate 7; therefore, the cost for heating can be reduced.

INDUSTRIAL APPLICABILITY

As explained above, according to the present invention, silicide is vaporized from liquid provided on a part of a liquid arranging surface to directly form a silicon thin-film, which can eliminate the use of a patterning process.

Further, according to the present invention, liquid may be arranged only on a part necessary for forming a thin-film, which can reduce the amount of liquid used.

Furthermore, by using an inkjet method to arrange liquid, liquid can be easily and accurately arranged.

Moreover, an active region and inactive region for a thin-film-forming surface using a self-assembled film are formed; therefore, a pattern of a silicon thin-film can be accurately formed.

Furthermore, by using separate substrates for a liquid arranging surface and a thin-film-forming surface, a silicon thin-film can be uniformly formed.

What is claimed is:

1. A method of forming a silicon thin-film which comprises:

a step of forming on one or more parts of a liquid arranging surface for arranging liquid on a first substrate an active region and inactive region for CVD;

a step of arranging on said liquid arranging surface liquid which contains a silicide comprising ring silane and/or a derivative thereof, said ring silane comprising silicon and hydrogen;

a step of arranging a thin-film-forming surface for forming a second substrate to be set facing the liquid arranging surface of said first substrate; and a step of vaporizing silicide from said liquid arranged on said liquid arranging surface of said first substrate and supplying said silicide to said thin-film-forming surface of said second substrate to selectively deposit a silicon thin-film.

2. A method of forming a silicon thin-film according to claim 1, wherein a solution in which cyclopentasilane and/or silylcyclopentasilane are/is dissolved in an organic solvent is used as said liquid containing silicide.

3. A method of forming a silicon thin-film according to claim 1, wherein said step of forming an active region and inactive region for CVD comprises:

a step of, when R is a fluoroalkyl group in which hydrogen on an end side of an alkyl group is substituted with fluorine and X is an alkoxy group or a halogen group, forming a self-assembled film on said liquid arranging surface on which a hydroxyl group exists, using a silane derivative indicated by the general formula $RSiX_3$; and a step of performing a physical treatment of said self-assembled film and removing a part of said self-assembled film which becomes an active region for CVD in order to form an active region and inactive region for chemical vapor disposition.

4. A method of forming a silicon thin-film according to claim 3, wherein said step of removing said self-assembled film performs ultraviolet ray irradiation through a photomask or electron beam irradiation to a necessary part as said physical treatment.

* * * * *

UNITED STATES PATENT AND TRADEMARK OFFICE
CERTIFICATE OF CORRECTION

PATENT NO. : 6,846,513 B2
DATED : January 25, 2005
INVENTOR(S) : Masahiro Furusawa et al.

It is certified that error appears in the above-identified patent and that said Letters Patent is hereby corrected as shown below:

<u>Title page,</u>
Item [73], should read:
-- Assignee: Seiko Epson Corporation, Tokyo (JP)
                JSR Corporation, Tokyo (JP) --.

Signed and Sealed this

Third Day of January, 2006

JON W. DUDAS
*Director of the United States Patent and Trademark Office*